(12) United States Patent
Finn

(10) Patent No.: US 9,839,160 B2
(45) Date of Patent: Dec. 5, 2017

(54) WATER-BASED COMPUTING SYSTEM

(71) Applicant: International Business Machines Corporation, Armonk, NY (US)

(72) Inventor: Peter G. Finn, Markham (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/437,491

(22) Filed: Feb. 21, 2017

(65) Prior Publication Data

US 2017/0164521 A1   Jun. 8, 2017

Related U.S. Application Data

(63) Continuation of application No. 14/147,636, filed on Jan. 6, 2014, now Pat. No. 9,648,777.

(51) Int. Cl.
*F03B 13/20* (2006.01)
*H05K 7/20* (2006.01)

(52) U.S. Cl.
CPC ......... *H05K 7/20709* (2013.01); *F03B 13/20* (2013.01); *F05B 2220/708* (2013.01)

(58) Field of Classification Search
CPC .............................. H05K 7/20709; F03B 13/20
See application file for complete search history.

(56) References Cited

U.S. PATENT DOCUMENTS

| | | |
|---|---|---|
| 5,305,184 A | 4/1994 | Andresen et al. |
| 6,559,552 B1 | 5/2003 | Ha |
| 7,054,230 B1 | 5/2006 | Nelson |
| 7,525,207 B2 * | 4/2009 | Clidaras .............. F03B 13/1885 290/42 |
| 7,557,456 B2 * | 7/2009 | Kornbluh ............ F03B 13/1845 290/42 |
| 8,004,104 B2 | 8/2011 | Hench |
| 8,218,322 B2 | 7/2012 | Clidaras et al. |
| 9,308,969 B2 * | 4/2016 | McEvoy ................. B63B 21/20 |
| 2010/0164229 A1 | 7/2010 | Lawson |
| 2011/0057448 A1 | 3/2011 | Page |
| 2011/0316337 A1 | 12/2011 | Pelio et al. |
| 2012/0013127 A1 | 1/2012 | Shpinev |
| 2013/0061073 A1 | 3/2013 | Hamamoto et al. |
| 2014/0145550 A1 | 5/2014 | Hitchcock et al. |
| 2015/0194813 A1 | 7/2015 | Finn |
| 2015/0249257 A1 * | 9/2015 | Liu ......................... H01M 8/16 429/401 |

OTHER PUBLICATIONS

Sverdlik, "Ocean-exploring floating data center is powered by waves and sun," 2003, pp. 1-3, Datacenter Dynamics.

(Continued)

*Primary Examiner* — Thienvu Tran
*Assistant Examiner* — Pinping Sun
(74) *Attorney, Agent, or Firm* — Daniel Simek; Hoffman Warnick LLC

(57) ABSTRACT

A water-based computing system is described. In one embodiment, the system comprises a plurality of interconnected computer nodes each placed in a waterproof container floating in a body of water. Each computer node is configured to generate power for use thereof and for the other interconnected computer nodes.

20 Claims, 8 Drawing Sheets

(56) References Cited

OTHER PUBLICATIONS

Reimer, "The ocean as a watercooler: floating data centers stay cool," 2008, pp. 1-2, Ars Technica.
Elahee et al., "Ocean Thermal Energy for Air-conditioning: Case Study of a Green Data Center," 2003, pp. 679-684, Energy Sources, Part A: Recovery, Utilization, and Environmental Effects.
Pinping, Office Action Communication for U.S. Appl. No. 14/147,636, dated Nov. 18, 2016, 22 pages.
Pinping, Notice of Allowance and Fee(s) Due for U.S. Appl. No. 14/147,636, dated Dec. 30, 2016, 8 pages.

\* cited by examiner

WATER-BASED COMPUTING SYSTEM

TECHNICAL FIELD

This invention relates generally to data centers, and more specifically, to placing computer systems of a data center in a water-based computing environment to facilitate powering and cooling of the computer systems.

BACKGROUND

A data center is generally a facility used to house computer systems and associated components, such as processing, storage and telecommunications systems. It generally includes redundant or backup power supplies, redundant data communications connections, environmental controls (e.g., air conditioning, fire suppression) and security devices. A typical large-scale data center consumes massive amounts of power and requires expensive cooling systems to support high network traffic volume demand for data processing and/or storage capacity.

SUMMARY

The various embodiments of the present invention are directed to obviating the high costs associated with powering and cooling the computer systems of a data center by placing it in a water-based computing environment. A water-based data center according to the various embodiments of the present invention can use wave, tidal or osmotic energy generated from a body of water to facilitate powering and cooling of the computer systems in the data center. In addition, the various embodiments of the present invention can use renewable energy sources like wind energy and solar energy to facilitate powering of the computer systems in the data center.

In one embodiment of the present invention, a system is disclosed. In this embodiment, the system comprises a plurality of interconnected computer nodes each placed in a waterproof container floating in a body of water. Each computer node is configured to generate power for use thereof and for other interconnected computer nodes.

In a second embodiment of the present invention, a water-based data center is disclosed. In this embodiment, the water-based data center comprises a platform floating in a body of water. A plurality of interconnected computer nodes is secured to the platform. Each of the computer nodes is placed in a waterproof container that is semi-submergible in the water while secured to the platform. Each waterproof container is configured to generate power for use thereof and for other interconnected computer nodes.

In a third embodiment of the present invention, a water-based computing system is disclosed. In this embodiment, the water-based computing system comprises one or more compute modules semi-submersible in a body of water and interconnected by a set of communication links, one or more data storage modules semi-submersible in the body of water and in communication with the compute modules, and one or more power storage modules interconnected with the compute modules and the data storage modules. At least one of the compute modules, the data storage modules and the power storage modules includes a power generation device selected from the group consisting of: a plurality of electroactive polymers configured to be tethered between the compute modules, the data storage modules, and the power storage modules to generate power as a function of wave motion in the body of water, a wave motion power generator that generates power as a function of the wave motion in the body of water, a solar power device adapted to be located on portions of the compute modules, the data storage modules and the power generation modules, a thermoelectric power device that uses the body of water and heat generated from the compute modules, the data storage modules and the power generation modules to generate power based on the Peltier Seebeck effect, an arrangement of a plurality of liquid metal dynamos fastened to the compute modules, the data storage modules and the power generation modules that generate power as a function of the wave motion of the body of water, and combinations thereof.

DETAILED DESCRIPTION

Figure 1:
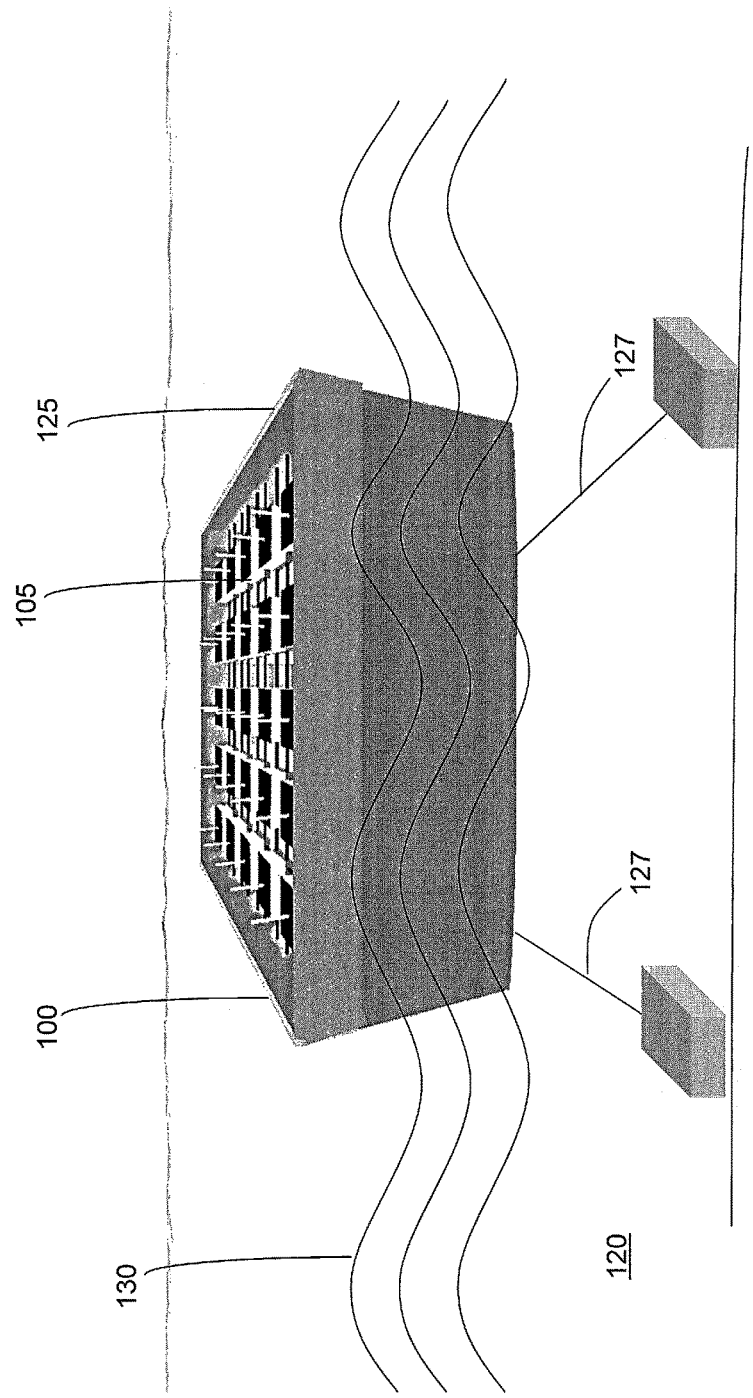
FIG. 1 shows a schematic diagram of a water-based data center according to an embodiment of this invention.

Referring to the figures, FIG. 1 shows a schematic of a water-based data center 100 containing a multitude of interconnected computer systems 105 forming computer nodes in the data center. Each computer node includes a waterproof cabinet or container that generally contains compute modules, data storage modules, and power storage modules. The compute modules generally include the systems that enable high performance computing, grid computing or cloud computing. The data storage modules generally include the systems that enable storage of operating systems, programs and data. The power storage modules generally include transformers and batteries for storing power that is generated in one of the approaches described herein. It is understood that each computer node can have other modules, such as, for example, network modules to facilitate communication between all of the modules in the node and communication with the other computer nodes in data center 100.

Figure 2:
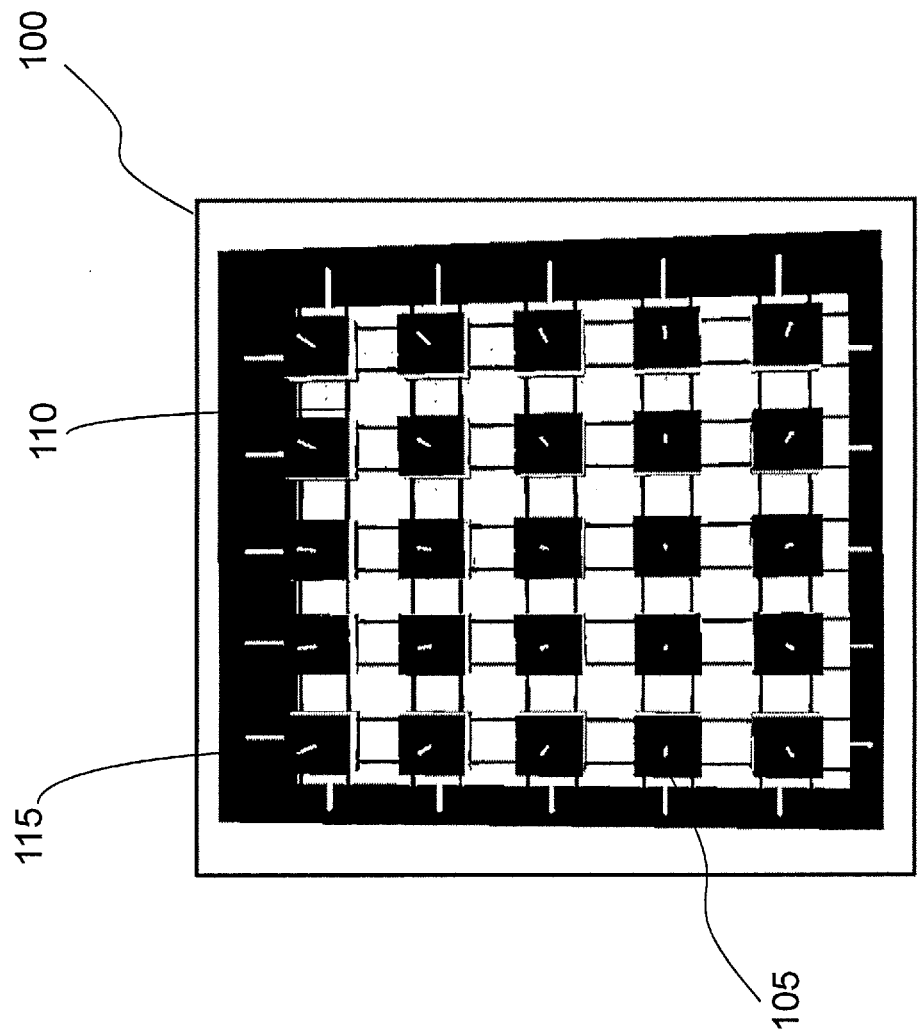
FIG. 2 shows a top view of the water-based data center depicted in FIG. 1 according to an embodiment of this invention.

A top view of data center 100 as illustrated in FIG. 2 shows more clearly the interconnection of computer systems 105 in data center 100. In one embodiment, as shown in FIGS. 1-2, computer systems 105 can be configured in a grid arrangement such that each system in data center 100 are interconnected. It is understood that computer systems 105 can be arranged in other configurations. In one embodiment, computer systems 105 can be operationally coupled together through wired connections 110 such as electrical cabling or through wireless communications 115.

Referring back to FIG. 1, the waterproof containers containing computer systems 105 are buoyant such that the containers can be semi-submergible in a body of water 120 like an ocean, a sea, a bay, a sound, a river, a lake, a pond, etc. As shown in FIG. 1, computer systems 105 can be secured to a platform 125 floating in water 120 such that each of the interconnected computer systems has a portion of their waterproof containers submerged in the water. Platform 125 can be secured in water 120 by using an anchor and cable configuration 127 or the like to maintain the position of the platform, and hence data center 100 in the water. It is understood that platform 125 is only an example of one approach that can be used to secure computer systems 105 in water 120, and those skilled in the art will appreciate that other buoyant containers, rigs, vessels can be configured to maintain the interconnected computer systems in a particular location, and to have portions of the waterproof containers holding them partially submersible in a body of water. Furthermore, it is understood that data center 100 may include more than one platform 125 or containment area securing the interconnected computer systems 105. In this scenario, each containment area could have rows of computer systems containing compute modules, data storage modules and power storage modules, each powered and cooled in the manner described below. In another embodiment, the interconnected computer systems can be configured in a body of water without a platform 125 or containment area. In this scenario, the computer systems can be secured to a particular location in the body of water with an anchor and cable configuration or the like to maintain the position of the systems in the water while generating power and cooling in the manner described below.

Although not shown in FIGS. 1-2, conventional modalities, such as for example, fiber cable laid underneath the floor of the body of water 120 can be used to move data to and from data center 100 to ground-based locations. In another embodiment, it is envisioned that future wireless communications will have the bandwidths to move data between data center 100 and ground-based locations, and is thus, another option for use with the water-based data center described herein.

The various embodiments of the present invention as described below in more detail can utilize wave energy from the movement or motion of waves 130 forming in water 120 to power the interconnected computer systems 105 in data center 100, obviating the need for an external power supply to provide power to the data center. Furthermore, as described below, the various embodiments of the present invention can use water 120 to provide cooling of computer systems 105 in data center 100, obviating the need to use expensive cooling systems to cool the data center.

Figure 3:
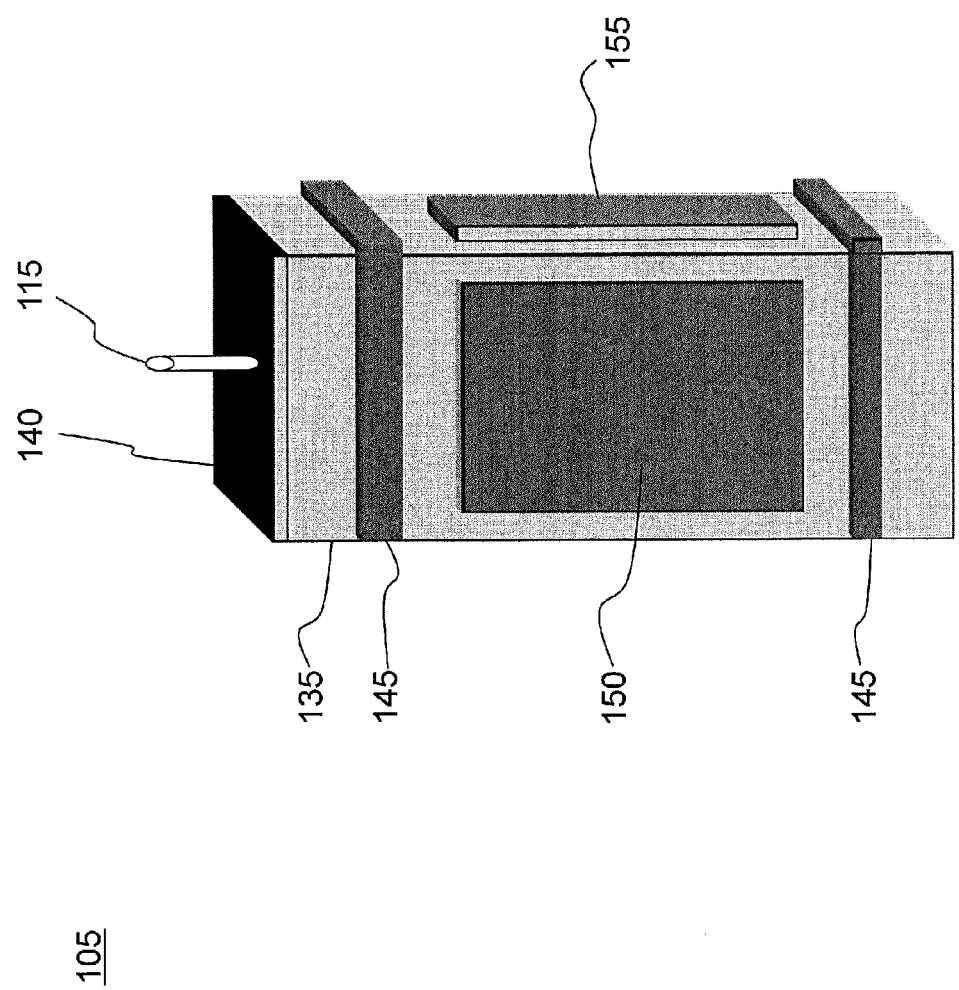
FIG. 3 shows a schematic diagram of a cabinet or container that can house a computer node or computer system in the water-based data center of FIGS. 1-2 having a solar power device, a battery power device and a thermoelectric power device according to an embodiment of the invention.

FIG. 3 shows a schematic diagram of a container 135 used to hold a computer system 105 from data center 100 that can contain modules such as compute modules, data storage modules, and power storage modules. In one embodiment, a solar power device 140 can be used in conjunction with the computer system 105 and its respective compute modules, data storage modules, and power storage modules that reside in container 135. Solar power device 140 can include, but is not limited to, solar panels containing modules of photovoltaic devices and concentrated solar power systems. Solar power device 140 can be located on the top surface or even portions of the side surfaces of container 135.

In this embodiment, power generated from solar power device 140 can be used to power the compute modules, the data storage modules, and the power storage modules in container 135 of computer system 105. In addition, any excess power generated from solar power device 140 that is not used by the compute modules, the data storage modules, and the power storage modules of computer system 105 can be stored in the power storage modules. In this manner, the excess power stored in the power storage modules can be used to power the compute modules and the data storage modules in the container, as well as to provide that power to the other interconnected computer systems 105 in data center 100.

It is understood that there may be some limitations in the amount of power generated from solar power device 140 if used with each container 135 in data center 100. Therefore, it may be desirable to use solar power device 140 in conjunction with other power generation techniques to generate power sufficient to power the interconnected computer systems 105 in data center 100.

A battery power device 145 is another power generation modality that can be used with computer system 105 to power the compute modules, the data storage modules, and the power storage modules therein, as well as provide power to the other interconnected computer systems 105 in data center 100. Like solar power device 140 and other power generation modules described herein, this power generation device can be used in conjunction with other power generation devices to supplement the power generated for each of the interconnected computer systems 105.

In one embodiment, battery power device 145 can include a Lithium type battery. For example, battery power device 145 can include a Lithium-air battery that has a higher energy density due to lighter cathodes and uses oxygen as its primary fuel. Another Lithium type battery that can be used includes a Lithium seawater battery for applications where the water-based data center 100 is implemented in a large body of water like an ocean, a sea, a sound, etc. A Lithium seawater battery generally makes use of both dissolved oxygen and the reduction of water to generate power. Lithium seawater batteries use the water as the positive electrode and are generally denser than the Lithium-air batteries. Although battery power device 145 is shown on the exterior of container 135, those skilled in the art will appreciate that such batteries can be placed on the interior. For example, battery power device 145 can be placed in the power storage modules associated with computer system 105.

In another embodiment, a computer system 105 in data center 100 can include a thermoelectric power device 150 that uses the difference in temperature of the water in which container 135 is submerged and the temperature of the computer system to generate power. In particular, a temperature gradient will develop between the "hotter" computer system 105 and the "colder" water in which the container holding the computer system is floating in. Per the well known Peltier-Seebeck effect, the temperature gradient can generate a thermoelectric voltage that is used by thermoelectric power device 150 to produce thermoelectric energy. Thermoelectric power device 150 can use this thermoelectric energy to provide power to the computer system 105 in container 135 including its compute modules, data storage module and power storage modules, as well as provide power to the other interconnected computer systems. Any excess power generated from thermoelectric power device 150 can be stored in the power storage module of computer system 105 and used to power itself or provided to the interconnected computer systems.

FIG. 3 also shows that container 135 can include sensors 155 to measure operational data associated with computer system 105 including the compute modules, the data storage modules, the power storage modules, the network modules and any of the power generation devices described herein. For example, sensors 155 can measure items such as water pressure, power, data transfer rates, etc. Those skilled in the art will readily recognize that such items are only examples of data that can be measured by sensors implemented with computer system 105 and are not meant to be limiting. Furthermore, it is understood that sensors 155 are shown on the exterior of computer system 105 on container 135, however, those skilled in the art will appreciate that sensors could be located on the interior of the container.

Figure 4:
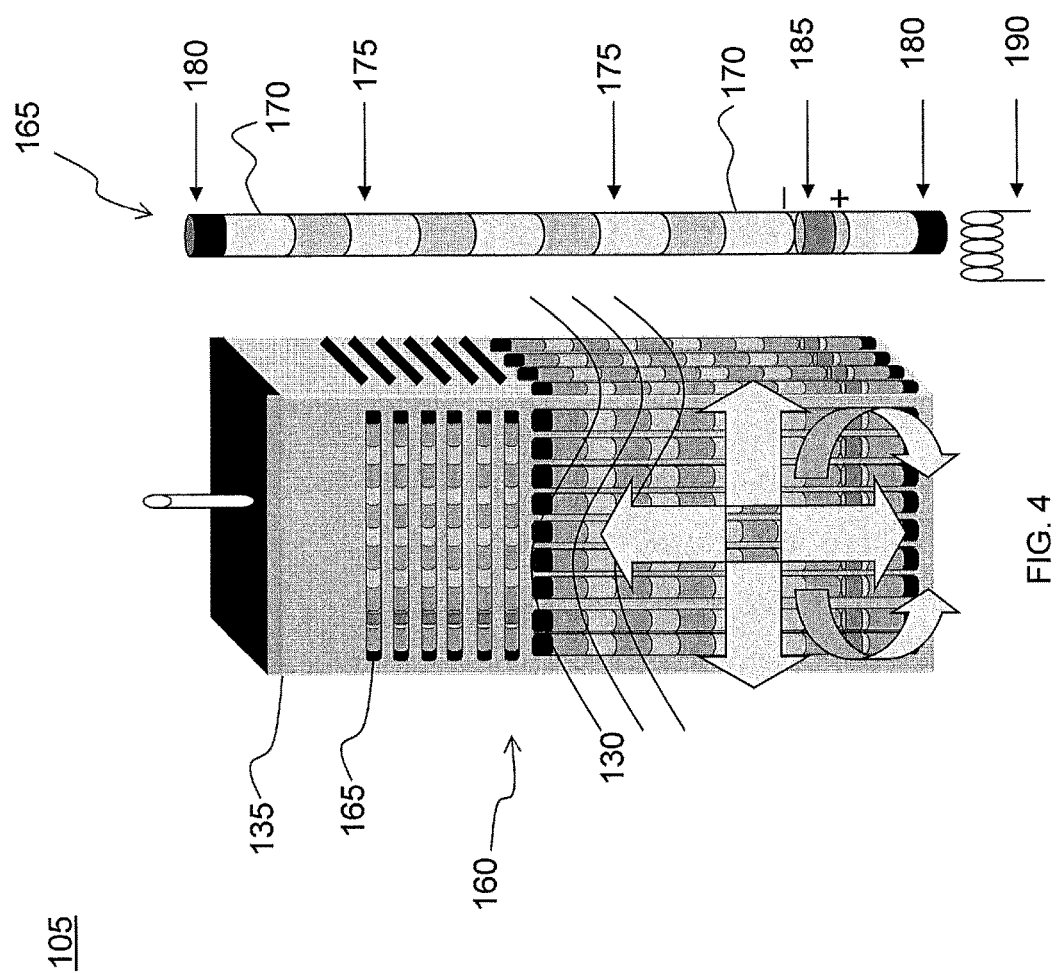
FIG. 4 shows a schematic diagram of a container that can house a computer system in the water-based data center of FIGS. 1-2 having an arrangement of amorphous or liquid metal dynamos according to an embodiment of the invention.

FIG. 4 shows a schematic diagram of a dynamo power device 160 in use with computer system 105 according to another embodiment. Dynamo power device 160 can be used to power the compute modules, the power storage module and the data storage modules in container 135, as well as provide power to the other interconnected computer systems 105 in data center 100. In one embodiment, dynamo power device 160 can include an arrangement of amorphous or liquid metal dynamos 165 that are configured to generate power as a function of the wave motion 130 of water 120 through a range of six degrees of motion that container 135 may move in the water.

As shown in FIG. 4, dynamos 165 can include a column 170 such as a self-contained rod with coils 175 such as copper winding and an amorphous liquid 180 stored at opposite ends of the column. Within column 170 is a magnet 185 (e.g., a Neodymium magnet) that is configured to travel up and down the column as a function of wave motion in water 120 "shaking" dynamo 165, enabling the dynamo to generate power. Amorphous liquid 180 stores kinetic energy produced from magnet 185 traveling up and down column 170. This kinetic energy can provide a "high" bounce so that when magnet 185 hits amorphous liquid 180, it can then travel or bounce several times. The high elasticity provided by amorphous liquid 180 extends the period that magnet 185 will continue to move in column 170, and thus, generate power for the computer system within container 135 including the compute modules, the power storage modules, the data storage modules and any other modules, and for the other interconnected computer systems. In this manner, dynamos 165 can provide maximum power generation as energy from wave motion allows magnet 185 within dynamo 165 to bounce against amorphous liquid 180 multiple times between waves, thus increasing energy generation time between waves. Any excess power generated from dynamos 165 can be stored in the power storage module in container 135 for powering computer system 105 and its respective modules, and for providing power to any of the other interconnected computer systems.

Amorphous liquid 180 can take the form of any amorphous metal alloy that is characterized with high elasticity in order to facilitate the travel of magnet 185 within column 170, and thus maximize power generation from dynamos 165 due to energy arising from wave motion in water 120. Other properties that amorphous liquid 180 can have include high strength to reduce fractures so that it can continually store the kinetic energy and be non-magnetic in order to function with magnet 185. LIQUIDMETAL and VITRELOY are commercially available amorphous liquids that are suitable for use with dynamos 165. It is understood that these amorphous liquids are only examples, and are not meant to limit the scope of the various embodiments described herein.

In one embodiment, dynamos 165 can be arranged on the exterior of container 135 in a vertical orientation, a horizontal orientation or a mix of both as shown in FIG. 4. Those skilled in the art will appreciate that placing dynamos 165 in a combination of a vertical orientation and a horizontal orientation can ensure maximum power generation irrespective of any motion created by waves in water 120. Regardless of the orientation, dynamos 165 can harness the wave energy resulting from the motion of waves in water 120.

FIG. 4 also shows that an electric magnet 190 can be placed in proximity to one of the ends of column 170 near amorphous liquid 180 in dynamo 165. In this manner, electric magnet 190 can be used to stop the motion of dynamo 165 during a storm. In such a situation as a storm, high wave activity can occur which can cause the generation of more power than is desirable leading to potential damage or overloading of component in data center 100. In one embodiment, a power monitor can be used to measure the amount of power generated from dynamos 165. If the power exceeds a predetermined threshold that is indicative of too much or an undesirable amount of power, then power generation from dynamos 165 can be shut off by. The power can then be fed back into electric magnet 190 causing magnet 185 with column 170 to be fixed in place, thus preventing further power generation until the power monitor determines that it is acceptable to again have dynamos 165 generate power.

Figure 5:
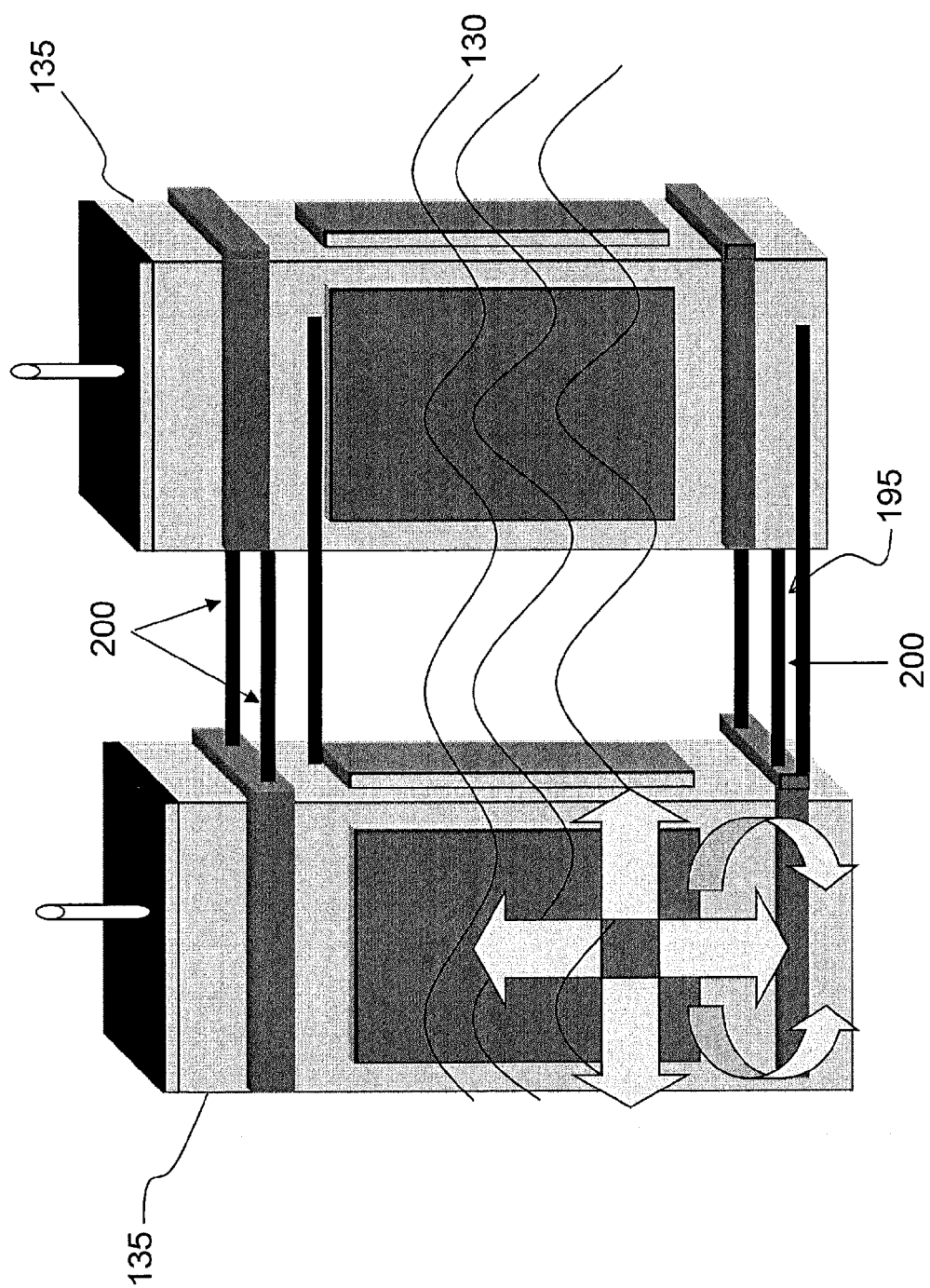
FIG. 5 shows a schematic diagram of containers that can house computer systems in the water-based data center of FIGS. 1-2 having an electroactive power device formed of electroactive polymers according to an embodiment of the invention.

FIG. 5 shows a schematic diagram of an electroactive polymer (EAP) power device 195 having an arrangement of EAPs 200 in use with containers 135 holding computer systems 105 for data center 100 according to another embodiment. In one embodiment, the EAP power device 195 with arrangement of EAPs 200 can be configured to move and generate power as a function of the wave motion of water 130 through a range of six degrees of motion that containers 135 may move in the water. EAPs are generally polymers that generate electricity when stretched to change in size or shape and return to its original shape. As a result, movement of EAPs 200 in water through six degrees of motion can be used to generate power from the electricity that arises during such movement. In this manner, EAP power device 195 can generate power for each computer system within containers 135 including their compute modules, power storage modules and data storage modules. In addition, the power generated from the EAP power device 195 can be used to power the other interconnected computer systems. As in other embodiments described heretofore, any excess power generated from the arrangement of EAPs 200 in EAP power device 195 can be stored in the power storage modules of the computer systems 105 in data center 100 for supplemental power.

In embodiments described herein, EAPs 200 can be used to generate power when in a bending or flexing position, and to stop the power generation when in a rigid or contracting position. As a result, some of EAPs 200 in FIG. 5 can be classified as flexing EAP devices that are configured to generate power when flexed in response to movement of containers 135 due to wave energy in water. Other EAPs 200 in FIG. 5 can be classified as contracting EAP devices that are configured to receive the power from the flexing EAP and contract to a rigid state to slow down or stop further power generation from EAP power device 195.

Stopping power generation can be beneficial during storms or high wave activity which would likely cause EAP power device 195 to generate too much power which could lead to damage or failure of components in data center 100. In one embodiment, a power monitor can be used to measure the amount of power generated from EAP power device 195. If the power exceeds a predetermined threshold that is indicative of too much or an undesirable amount of power, then power generation from EAP power device 195 can be shut off by creating a rigid linkage between the computer systems containing compute modules, power storage modules and data storage modules. In particular, EAP power device 195 can be configured to feed power from one or more of the flexing EAPs to one or more of the contracting EAPs. This causes the contracting EAPs to contract, thereby stiffening the entire EAP power device 195 into the rigid linkage, creating a single solid platform for the computer systems.

This stops the computer systems from bobbing up and down in the water, reducing and/or stopping further power generation. Once a power monitor determines that the wave activity is at an acceptable level, then the flexing EAPs can stop diverting power to the contracting EAPs, thereby creating a more flexible EAP power device 195 that is able to generate power used for data center 100.

Figure 6:
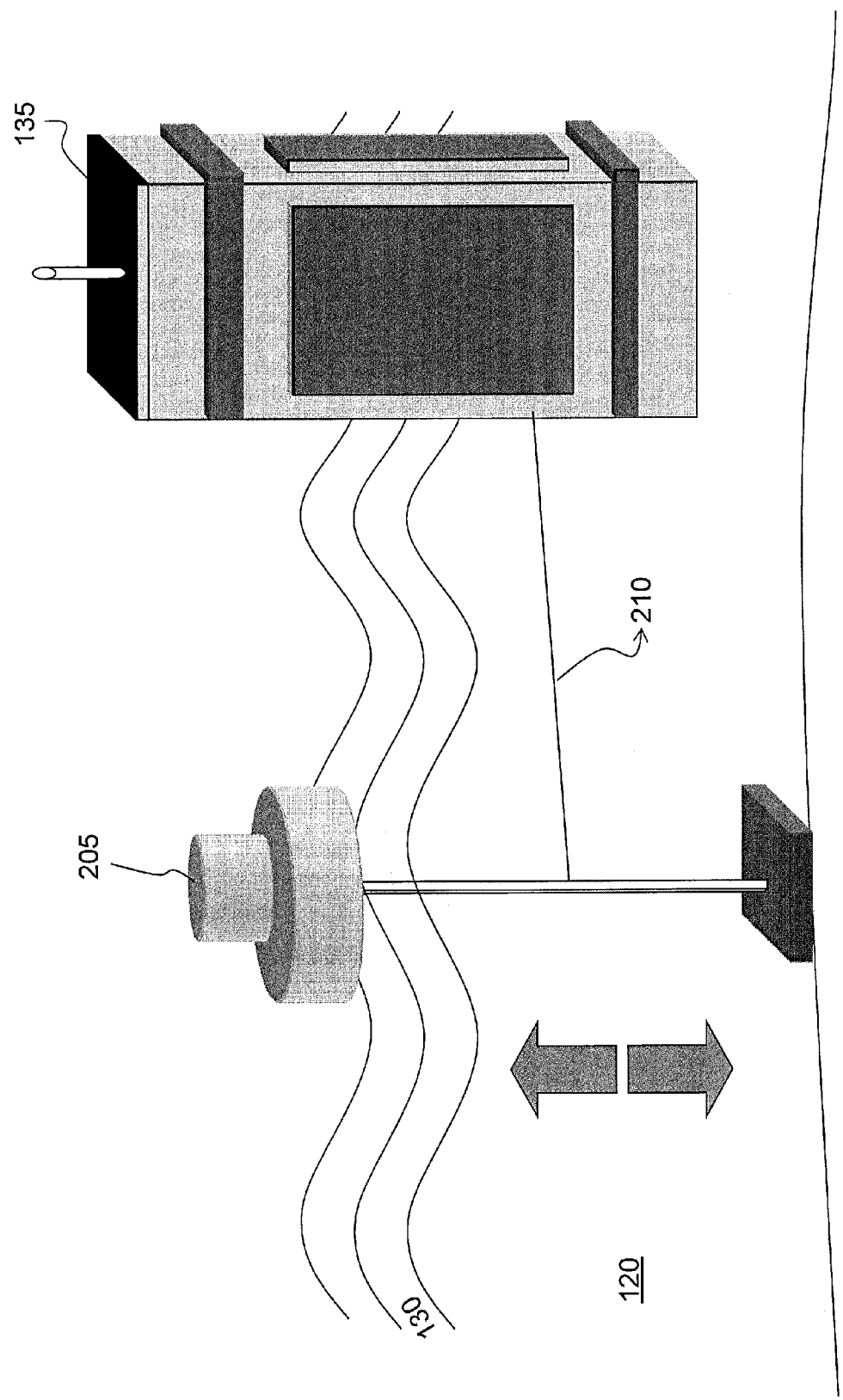
FIG. 6 shows a schematic diagram of a wave motion power generator in operation with a container that can house a computer system used in the water-based data center of FIGS. 1-2 according to an embodiment of the invention.

FIG. 6 shows a schematic diagram of a wave motion power generator device 205 for use with a container 135 containing a computer system 105 according to another embodiment. In one embodiment, wave motion power generator device 205 can float in water 120 while tethered to a bottom surface of the body of water. Generally, wave motion power generator device 205 moves two degrees of motion relative to the wave action 130 in water 120. Although not shown in FIG. 6, wave motion power generator device 205 can have a mechanical-type energy converter (e.g., a hydraulic energy converter) such as a wave energy converter that generates power as a function of the relative movement of the device to the wave action in water 120. Wave motion power generator device 205 can be tethered and wired to container 135 and the computer system held therein through a connection 210. In another embodiment, connection 210 can be made to platform 105 (FIG. 1) to provide power to computer system 105 in container 135 and to the other interconnected systems in data center 100. In another embodiment, wave motion power generator device 205 can be integrated with container 135.

In one embodiment, wave motion power generator device 205 can take the form of a wave buoy point absorber that uses a buoy that floats above the water surface. The buoy can reside in a fixed cylinder that moves relative to wave action 130 in water 120. This motion will drive the energy converter to generate power for the compute modules, data storage modules, power modules in the computer system 105 held in container 135 and can provide this power to the other computer systems in data center 100.

In operation, movement of container 135 in the waves 130 of water 120 would cause wave motion power generator device 205 to generate power that can be fed be into the compute modules, data storage modules, power storage modules or any other modules that can be used in a computer system 105. The power from wave motion power generator device 205 can also be provided to other computer systems that are interconnected to container 135. In addition, any excess power generated from wave motion power generator device 205 can be stored in the power storage modules of container 135 and used later by the computer system therein or by one of the other interconnected computer systems in the data center.

Figure 7:
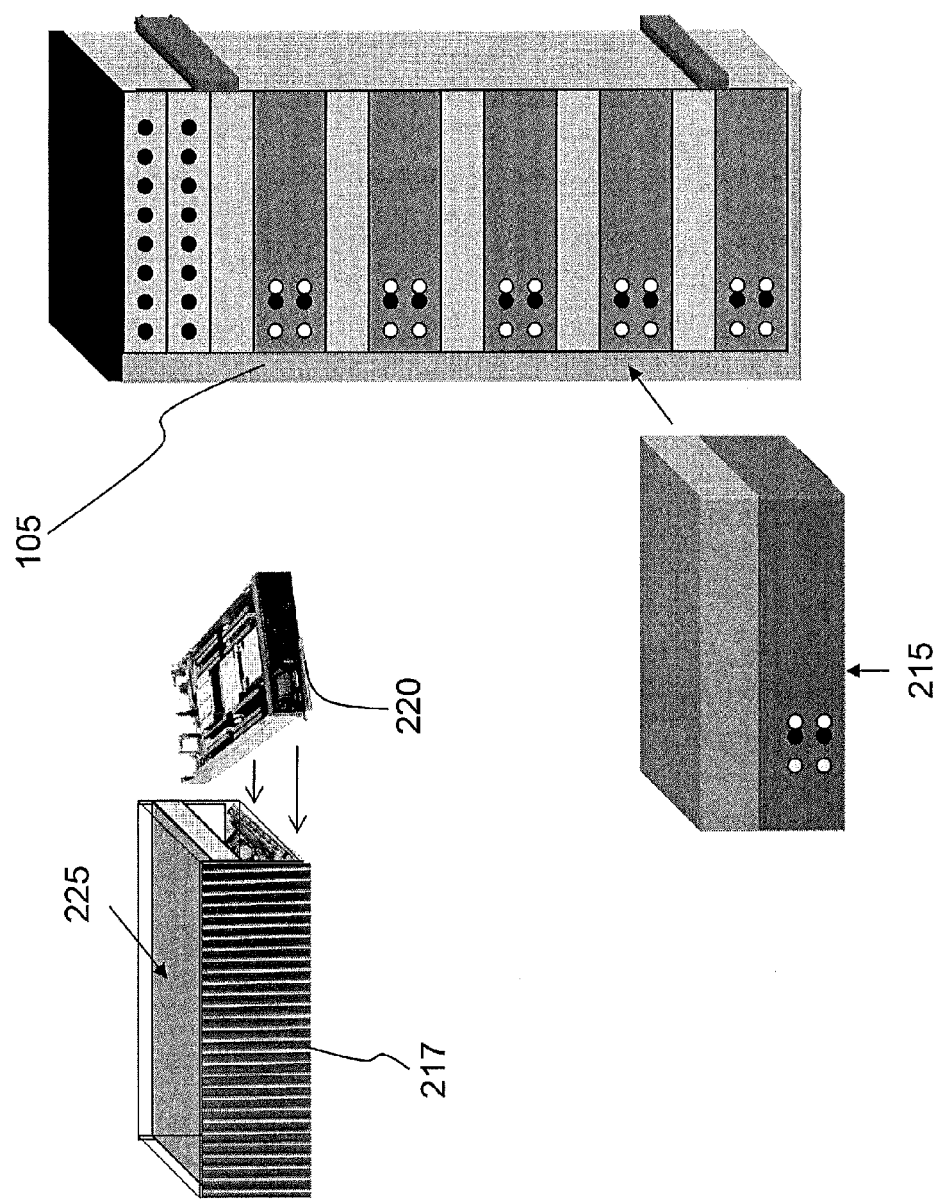
FIG. 7 shows a schematic diagram of a computer system depicted in the water-based data center of FIGS. 1-2 with compute modules, data storage modules, and power storage modules according to an embodiment of the invention.

FIG. 7 shows a schematic diagram of a computer system 105 that can be implemented in the water-based data center 100 depicted in FIGS. 1-2 without the waterproof containers or cabinets illustrated in FIGS. 3-6. In particular, FIG. 7 shows modules 215 of computer system 105 that are placed on racks in the container housing the system. As mentioned above, these modules 215 can include compute modules, data storage modules, power modules, network modules for connecting these modules, and any other modules that can be implemented. Each of these modules can be housed in a waterproof container 217 to provide further waterproofing protection to components 220 that form modules 215.

In one embodiment, the aforementioned Peltier-Seebeck effect can be used to cool the computer system 105. For example, as illustrated in FIG. 7, a cooling module 225 can be attached to the waterproof container 217 housing components 220 to provide cooling thereto. In one embodiment, cooling module 225 can include a cooling heat sink containing a non-electrical conductive liquid that is sealed off from components 220. In this manner, the sealed cooling heat sink can provide heat transfer to components 220, thereby cooling computer system 105. In one embodiment, the non-electrical conductive liquid can include a commercially available electronics coolant liquid like FLUORINERT. In one embodiment, the cooling heat sink can include a Peltier-Seebeck heat sink that uses the difference in the "cold" temperature of the non-electrical conductive liquid and the "hot" temperature of components 220 to facilitate a heat transfer between the heat sink and the components.

Figure 8:
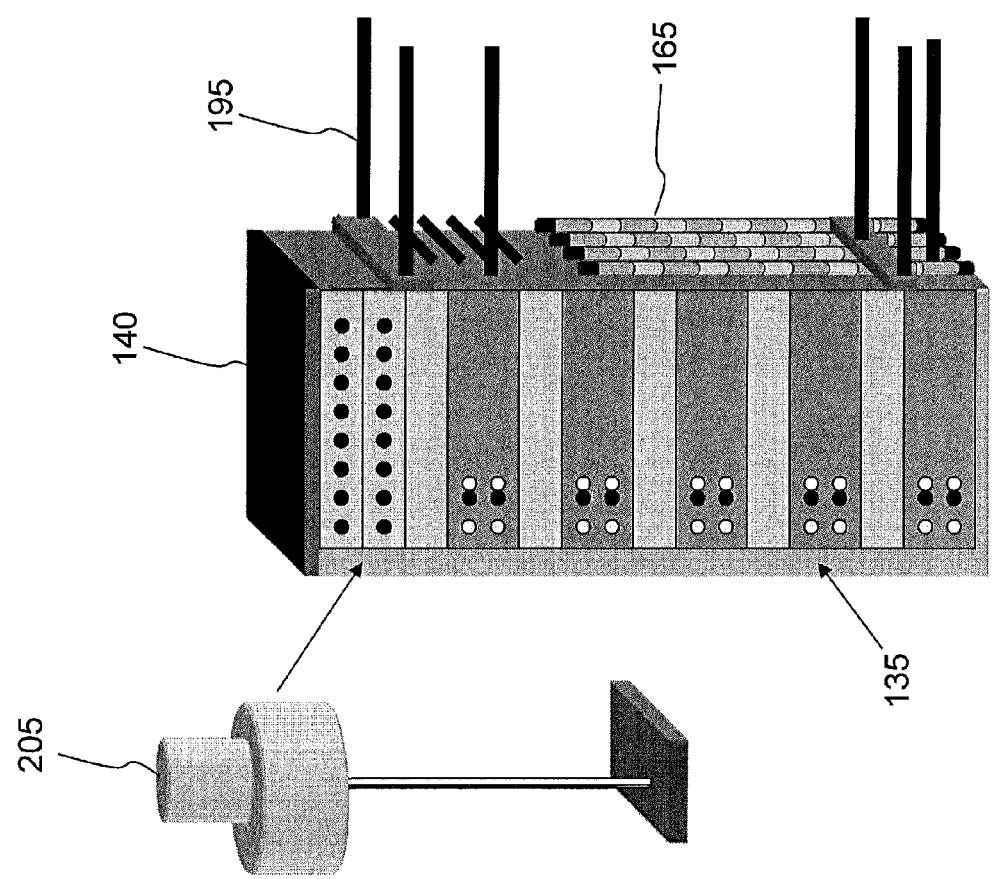
FIG. 8 shows a schematic diagram of a computer system depicted in the water-based data center of FIGS. 1-2 with compute modules, data storage modules, and power storage modules that can have a power generation device formed from a combination of power generation devices according to an embodiment of the invention.

FIG. 8 shows a schematic diagram of a combination of some of the aforementioned power generation devices in use with container 135 containing a computer system 105 from data center 100 according to another embodiment. This combination of power generation devices can be used to power any of the modules in computer system 105 such as, for example, the compute modules, the data storage modules, and the power storage modules. In addition, this combination of power generation devices can be used to power any of the other interconnected computer systems in data center 100.

It is understood that the other power generation devices may be suitable for use with the computer systems 105 in data center 100. For example, a renewable energy power generation device may be used with each computer system 105 in data center 100 in order to enable the computer system to generate power for its use and use by any of the other interconnected computer systems. As used herein, a renewable energy power generation device encompasses any types of wind, wave, solar, tidal or osmotic power generation device that enables a computer system in a water-based data center that is semi-immersed in a body of water to collect power for use by the computer system, and for use by any of the other interconnected computer systems in the data center.

As in other embodiments, any excess power generated from the combination of power generation devices can be stored in a power storage module of computer system 105 or in another power storage module of a computer system in the data center, and be used to power any of the modules in the computer systems.

In this embodiment, any combination of the power generation devices described with respect to FIGS. 3-7 can be used. As an example, FIG. 8 shows container 135 containing a computer system can be configured with a solar power device 140, an arrangement of amorphous metal dynamos 165, an EAP power device 195, and a wave motion power generator device 205. In one embodiment, solar power device 140 can be the primary source of power generation, and use of at least one of amorphous metal dynamos 165, EAP power device 195, and wave motion power generator device 205 can be initiated to generate power if power generated from the solar power device is insufficient.

It is understood that the implementation illustrated in FIG. 8 is only an example of how the power generation devices described herein can be used in combination with each other to make each computer system 105 in a data center 100 capable of generating power, as well as providing power that they have generated to the other interconnected computer systems 105 in data center 100. Those skilled in the art will appreciate that other combinations can be configured in other implementations.

Furthermore, those skilled in the art will appreciate that other power generation devices can utilize wave energy in a body of water to generate power can be implemented with computer system 105 in water-based data center 100, enabling these computer nodes with the capability of generating power and providing power to other computer systems. For example, computer systems 105 in data center 100 can be oriented to form a chamber so that water enters through a sub-surface opening into the chamber with air trapped above it. In this manner, the water column can move like a piston to force air through an opening in the chamber that is connected to turbines generating power for the compute nodes. In another embodiment, computer systems 105 in data center 100 can be oriented parallel to the direction of waves in the water to form wave energy attenuators. Computer systems 105 can then be interconnected with hydraulic pumps. In this manner, changes in wave height will cause flexing of the interconnected compute node joints. The flexing components connected to the hydraulic pumps can then be converted into power for compute nodes formed by the computer systems 105 that make up the water-based data center 100.

It is apparent that there has been provided with this invention an approach for providing a water-based computing system such as a data center. While the invention has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A water-based data center, comprising:
a platform in a body of a water; and
a plurality of interconnected computer nodes secured to the platform;
wherein at least one of the computer nodes comprises a plurality of flexing electroactive polymer power devices and a plurality of contracting electroactive polymer power devices, the plurality of flexing electroactive polymer power devices generating power when flexed in response to movement of the plurality of interconnected computer nodes, and wherein the plurality of contracting electroactive polymer power devices are configured to receive the power from the plurality of flexing electroactive polymer power devices when wave energy of the water exceeds a threshold, the plurality of contracting electroactive polymer power devices contracting in response to receiving the power from the plurality of flexing electroactive polymer power devices, slowing down power generated from the plurality of flexing electroactive polymer power devices.

2. The water-based data center according to claim 1, wherein at least one computer node includes a solar power device.

3. The water-based data center according to claim 1, wherein at least one computer node includes a thermoelectric power device.

4. The water-based data center according to claim 1, wherein at least one computer node includes a wave motion power generator device.

5. The water-based data center according to claim 1, wherein at least one computer node includes a dynamo power device having an arrangement of a plurality of amorphous metal dynamos each configured to generate power through various ranges of movement in the body of water.

6. The water-based data center according to claim 1, further comprising a cooling module attached to each of the plurality of interconnected computer nodes to provide cooling to each computer node.

7. The water-based data center according to claim 6, wherein each cooling module comprises a sealed cooling heat sink containing a non-electrical conductive liquid that provides heat transfer to the computer node coupled thereto.

8. The water-based data center according to claim 1, wherein each computer node comprises at least one compute module, at least one data storage module, and at least power storage module.

9. The water-based data center according to claim 8, wherein the power storage module is configured to store excess power generated by the computer node and for subsequent use by the computer node or any other of the interconnected computer nodes.

10. The water-based data center according to claim 8, wherein the power storage module comprise a battery power device.

11. The water-based data center according to claim 1, wherein each computer node comprises a data connection that transmits and receives data to and from a remote location.

12. The water-based data center according to claim 1, further comprising at least one anchoring device that anchors the platform within the body of water.

13. A water-based platform, comprising:
a plurality of interconnected computer nodes coupled to the platform;
wherein at least one of the computer nodes comprises a plurality of flexing electroactive polymer power devices and a plurality of contracting electroactive polymer power devices, the plurality of flexing electroactive polymer power devices generating power when flexed in response to movement of the plurality of interconnected computer nodes, and wherein the plurality of contracting electroactive polymer power devices are configured to receive the power from the plurality of flexing electroactive polymer power devices when wave energy of the water exceeds a threshold, the plurality of contracting electroactive polymer power devices contracting in response to receiving the power from the plurality of flexing electroactive polymer power devices, slowing down power generated from the plurality of flexing electroactive polymer power devices.

14. The water-based platform according to claim 13, wherein at least one of the computer nodes includes a solar power device, a thermoelectric power device, a wave motion power generator device, or a dynamo power device.

15. The water-based platform according to claim 13, further comprising a cooling module attached to at least one of the plurality of interconnected computer nodes to provide cooling.

16. The water-based platform according to claim 15, wherein the cooling module comprises a sealed cooling heat sink containing a non-electrical conductive liquid that provides heat transfer to the computer node coupled thereto.

17. The water-based platform according to claim 13, wherein each computer node comprises at least one compute module, at least one data storage module, and at least power storage module.

18. The water-based platform according to claim 17, wherein the power storage module is configured to store excess power generated by the computer node and for subsequent use by the computer node or any other of the interconnected computer nodes.

19. The water-based platform according to claim 17, wherein the power storage module comprise a battery power device.

20. The water-based platform according to claim 13, wherein each computer node comprises a data connection that transmits and receives data to and from a remote location.

\* \* \* \* \*